United States Patent
Liu

(10) Patent No.: US 7,932,519 B1
(45) Date of Patent: Apr. 26, 2011

(54) PIXEL STRUCTURE

(75) Inventor: Chih-Chung Liu, Shen-zhen (CN)

(73) Assignee: Century Display(ShenZhen)Co.,Ltd., Longhua, Baoan, Shen-zhen, Guangdong (CN)

( * ) Notice: Subject to any disclaimer, the term of this patent is extended or adjusted under 35 U.S.C. 154(b) by 0 days.

(21) Appl. No.: 12/868,711

(22) Filed: Aug. 25, 2010

Related U.S. Application Data

(63) Continuation of application No. PCT/CN2010/070045, filed on Jan. 7, 2010.

(30) Foreign Application Priority Data

Dec. 28, 2009 (CN) .......................... 2009 1 0265417

(51) Int. Cl.
*H01L 33/16* (2010.01)

(52) U.S. Cl. ................ 257/59; 257/48; 257/43; 257/72; 257/66; 257/E23.001; 257/E29.32; 257/E27.132; 257/E29.117; 257/E33.053

(58) Field of Classification Search .................... 257/59, 257/48, 72, 43, 66, E23.001, E29.32, E27.131, 257/E27.132, E29.117, E33.053
See application file for complete search history.

(56) References Cited

U.S. PATENT DOCUMENTS

| | | | |
|---|---|---|---|
| 5,097,297 A | | 3/1992 | Nakazawa |
| 2010/0026669 A1 * | | 2/2010 | Lee et al. ...................... 345/204 |
| 2010/0066935 A1 * | | 3/2010 | Mori .............................. 349/46 |

FOREIGN PATENT DOCUMENTS

| | | |
|---|---|---|
| CN | CN201000520 | 1/2008 |
| CN | CN101359692 | 2/2009 |

* cited by examiner

*Primary Examiner* — Wael M Fahmy
*Assistant Examiner* — Marc Armand
(74) *Attorney, Agent, or Firm* — Winston Hsu; Scott Margo

(57) ABSTRACT

A pixel structure includes a scan line, a data line, a gate electrode, a semiconductor layer, a source electrode, a drain electrode including a comb-shaped part surrounding the source electrode and a connecting part, and a pixel electrode electrically connected to the drain electrode. The scan line and the data line are arranged intersectedly and electrically insulated from each other. At least a portion of the source electrode and the drain electrode are disposed on the semiconductor layer. At least one branch of the comb-shaped part extends outside one side of the gate electrode to form a protrusion part. The connecting part extends from the comb-shaped part beyond the other side of the gate electrode. The protrusion part and the connecting part aligned with the margin of the gate electrode have a first width and a third width respectively, wherein the first width substantially equals to the third width.

22 Claims, 6 Drawing Sheets

PIXEL STRUCTURE

CROSS REFERENCE TO RELATED APPLICATIONS

This application is a continuation of International Application No. PCT/CN2010/070045 filed on Jan. 7, 2010.

BACKGROUND OF THE INVENTION

1. Field of the Invention

The present invention relates to a pixel structure, and more particularly, to a pixel structure having thin film transistors with a parasitic capacitance compensation structure to improve display picture quality.

2. Description of the Prior Art

A conventional thin film transistor liquid crystal display device primarily includes a thin film transistor array substrate, a counter substrate and a liquid crystal layer sandwiched in between the two substrates. The thin film transistor array substrate primarily includes a plurality of scan lines, a plurality of data lines, a plurality of thin film transistors disposed between the scan lines and the data lines, and a pixel electrode disposed correspondingly to each of the thin film transistors. The counter substrate includes a common electrode. Each of the thin film transistor described above includes a gate electrode, a semiconductor layer, a source electrode and a drain electrode, serving as a switch unit for the liquid crystal display unit.

The manufacturing process of the thin film transistor array substrate typically includes multiple exposure, photolithography and etching steps. In a typical manufacturing process, the gate electrode and the scan line are formed by a first metal layer (Metal 1) whereas the source electrode, the drain electrode and the data line are formed by a second metal layer (Metal 2). Also, at least a dielectric layer is disposed between the Metal 1 and the Metal 2. In the structure of the thin film transistor, the gate electrode at least partially overlaps the drain electrode, therefore a gate-drain electrode parasitic capacitance (referred to as Cgd) often exists due to the overlapping of the gate electrode and the drain electrode.

As for the liquid crystal display devices, a Clc voltage transferred from the data line is applied to a liquid crystal capacitor Clc formed by the pixel electrode, the common electrode and the liquid crystal layer; and the Clc voltage has a particular relationship with respect to the light transmittance of liquid crystal molecules in the liquid crystal layer. Therefore, the predetermined images can be displayed on the display device via controlling the Clc voltage applied to the liquid crystal capacitor Clc in accordance with the display images. However, due to the presence of the gate-drain electrode parasitic capacitance Cgd, the Clc voltage maintained on the liquid crystal capacitor Clc varies with respect to a voltage variation of the scan line. Such Clc voltage variation is known as the feed-through voltage ΔVp, and can be represented by the equation (1) below:

$$\Delta Vp = [Cgd/(Clc+Cgd+Cst)](Vgon-Vgoff) \quad (1)$$

wherein Vgon−Vgoff represents the voltage variation of the scan line, and Cst stands for the storage capacitor.

During the thin film transistor manufacturing process, misalignments induced by machine variance cause variation in the overlapping area between the gate electrode and the drain electrode for each thin film transistor, accordingly resulting in gate-drain parasitic capacitance Cgd variations. As a result, pixels would have different feed-through voltages ΔVp, causing display picture quality degradation such as flickering.

In order to overcome the negative impacts induced by the gate-drain electrode parasitic capacitance Cgd variation, U.S. Pat. No. 5,097,297, Chinese Patent Publication Number 101359692 and Chinese Patent Number 201000520 provide some different pixel structure designs respectively. The technology provided by these patents is useful to solve parasitic capacitance Cgd variation, however, in some particular cases, there are some particular thin film transistor designs that the aforementioned references may not be suitable to solve such particular technical problems. Therefore, the negative impacts on the displaying picture quality induced by the gate-drain electrode parasitic capacitance Cgd variations remain to be resolved.

SUMMARY OF THE INVENTION

The present invention provides a pixel structure capable of effectively resolving the problem of the gate-drain electrode parasitic capacitance Cgd variation induced by the misalignments of the thin film transistor manufacturing process.

The present invention provides a pixel structure, including a scan line, a data line, a gate electrode, a semiconductor layer, a source electrode, a drain electrode and a pixel electrode. The scan line and the data line are arranged intersectedly and electrically insulated from each other. The gate electrode is electrically connected to the scan line. The semiconductor layer is disposed on the gate electrode. At least a portion of the source electrode and at least a portion of the drain electrode are disposed on the semiconductor layer. The source electrode is connected to the data line. The drain electrode includes a comb-shaped part surrounding the source electrode and a connecting part. The comb-shaped part includes at least two branches, at least one of the branches extending outside the gate electrode to form at least a protrusion part outside the gate electrode. The connecting part extends from the comb-shaped part beyond the gate electrode, and the protrusion part and the connecting part are respectively disposed on two opposite sides of the gate electrode. The protrusion part aligned with the margin of the gate electrode has a first width, and the connecting part aligned with the margin of the gate electrode has a third width, wherein the first width is substantially equal to the third width. The pixel electrode is electrically connected to the connecting part of the drain electrode.

According to an embodiment of the present invention, one of the branches extends outside the gate electrode, and the other branch is disposed within the region of the gate electrode completely, so that one protrusion part exists. For example, the source electrode is disposed between the protrusion part and the scan line. Or, the protrusion part is disposed between the source electrode and the scan line. Furthermore, the first width is substantially equal to the width of the protrusion part.

According to one of the embodiments of the present invention, two of the branches extend outside the gate electrode so there are two protrusion parts. Meanwhile, the first width is substantially equal to the sum of the widths of the two protrusion parts. In another embodiment, the width of each one of the two protrusion parts is substantially the same. In another embodiment, the width of each one of the two protrusion parts is substantially different.

According to an embodiment of the present invention, the connecting part includes a contacting part disposed on one side of the connecting part away from the comb-shaped part, and the pixel electrode contacts the contacting part.

According to an embodiment of the present invention, the comb-shaped part is substantially formed by the at least two branches with a base, at least two branches extend from the base toward a first direction, and the connecting part is connected to the base and extends from the base toward a direction opposite to the first direction.

According to an embodiment of the present invention, the comb-shaped part and the connecting part substantially form a fork shape.

According to an embodiment of the present invention, the comb-shaped part and the connecting part of the drain electrode are formed integrally.

According to an embodiment of the present invention, the source electrode and the data line are formed integrally.

According to an embodiment of the present invention, the gate electrode disposed beyond the scan line and the scan line are formed integrally.

According to an embodiment of the present invention, the branches are parallel to the data line.

According to an embodiment of the present invention, a portion of the gate electrode is formed by the scan line.

According to an embodiment of the present invention, the protrusion part and the connecting part are respectively disposed on two opposite sides of the scan line.

The present invention further provides a pixel structure, including a scan line, a data line, a gate electrode, a semiconductor layer, a source electrode, a drain electrode and a pixel electrode. The scan line and the data line are arranged intersectedly and electrically insulated from each other. The gate electrode is electrically connected to the scan line, and the semiconductor layer is disposed on the gate electrode. At least a portion of the source electrode is disposed on the semiconductor layer and connected to the data line. At least a portion of the drain electrode is disposed on the semiconductor layer. Furthermore, the drain electrode includes a comb-shaped part and a connecting part. The comb-shaped part surrounds the source electrode, and the comb-shaped part includes at least two branches. A least one of these branches includes a first parallel part, a sloped part and a second parallel part to form the branch having an angular portion, wherein the sloped part is connected to the first parallel part and the second parallel part, and the second parallel part extends outside the gate electrode to form at least one protrusion part. The connecting part extends from the comb-shaped part beyond the gate electrode, and the protrusion part and the connecting part are respectively disposed on the two opposite sides of the gate electrode. The protrusion part aligned with the margin of the gate electrode has a first width. The connecting part aligned with the margin of the gate electrode has a third width, and the first width is substantially equal to the third width. The pixel electrode is electrically connected to the drain electrode.

According to an embodiment of the present invention, the source electrode is disposed between the protrusion part and the scan line.

According to an embodiment of the present invention, the first width is substantially equal to the width of the protrusion part.

According to an embodiment of the present invention, the connecting part comprises a contacting part, disposed on one side of the connecting part away from the comb-shaped part, and the pixel electrode contacts the contacting part.

According to an embodiment of the present invention, the comb-shaped part is substantially formed by the at least two branches and a base, and the at least two branches extend from the base toward one direction, and the connecting part is connected to the base and extends from the base toward the opposite direction.

According to an embodiment of the present invention, the connecting part partially overlaps the gate electrode.

According to an embodiment of the present invention, the comb-shaped part and the connecting part substantially form a fork shape.

According to an embodiment of the present invention, the margin of the gate electrode either extends to overlap the portion of the data line or extends to overlap both of the portions of the scan line and the data line.

According to an embodiment of the present invention, the protrusion part is located outside the semiconductor layer.

As mentioned above, in the present invention, the drain electrode on the two opposite sides of the gate electrode has a protrusive pattern respectively, and the protrusive pattern is located outside the gate electrode. Therefore, during the manufacturing process of the thin film transistor, the relative deviation between the first conductive layer (first metal layer) and the second conductive layer (second metal layer) does not affect the overlapping area between the gate electrode and the drain electrode. In other words, the value of each pixel's gate-drain electrode parasitic capacitance is constant. Therefore, in accordance with the present invention, the process deviation of the pixel structure due to the misalignments may not cause negative impacts on the display. In other words, the pixel structure of the present invention possesses excellent picture quality with high product yield.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
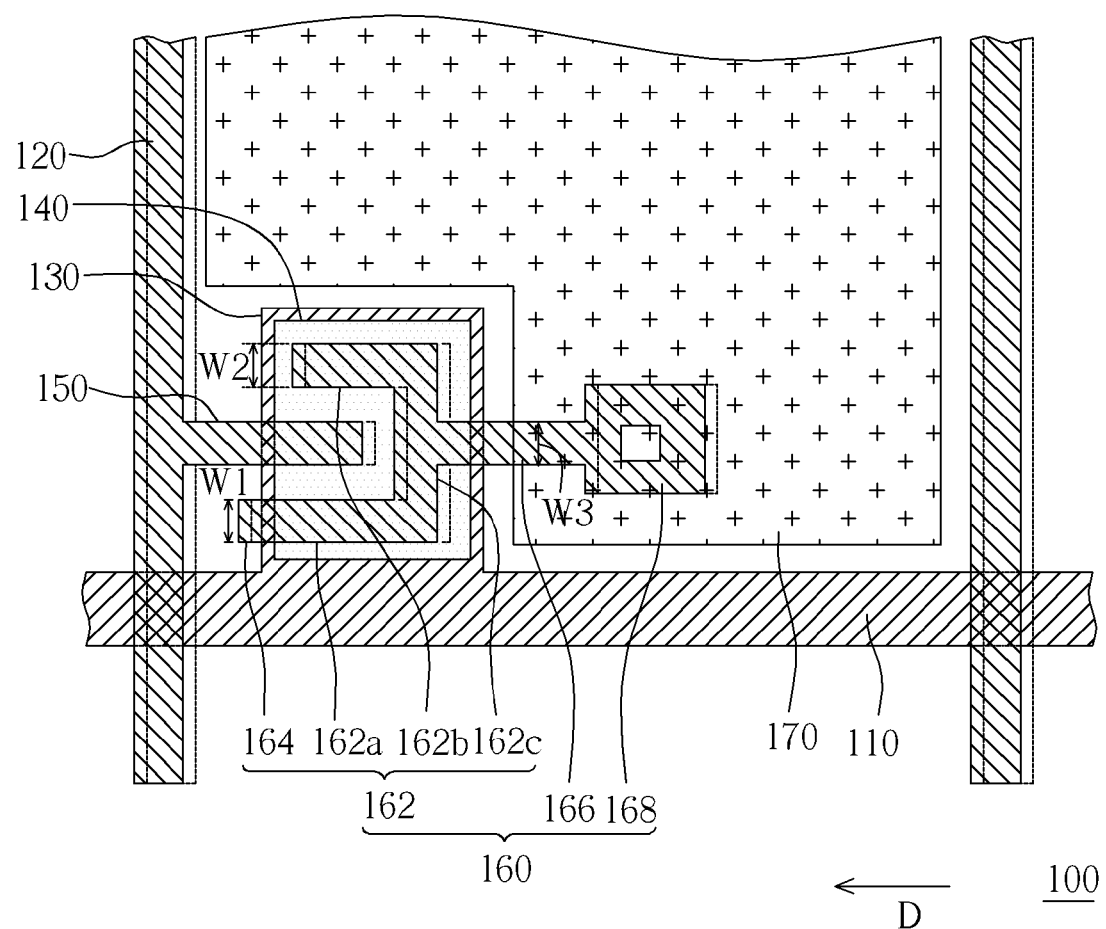
FIG. 1 is a schematic sectional top view diagram illustrating a pixel structure in accordance with a first embodiment of the present invention.

FIG. 1 is a schematic sectional top view diagram illustrating a pixel structure in accordance with the first embodiment of the present invention. Referring to FIG. 1, a pixel structure 100 includes a scan line 110, a data line 120, a gate electrode 130, a semiconductor layer 140, a source electrode 150, a drain electrode 160 and a pixel electrode 170. The scan line 110 and the data line 120 are arranged intersectedly and electrically insulated from each other. The gate electrode 130 is connected to the scan line 110. The semiconductor layer 140 is disposed on the gate electrode 130. At least a portion of the source electrode 150 and a portion of the drain electrode 160 are disposed on the semiconductor layer 140, and the source electrode 150 is connected to the data line 120. In accordance with the present embodiment, a thin film transistor (not illustrated) is composed of the gate electrode 130, the semiconductor layer 140, the source electrode 150 and the drain electrode 160. The pixel electrode 170 is then electrically connected to the drain electrode 160, so that the signals transferred from the data line 120 may be controlled by turning on or off the thin film transistor.

In the present embodiment, the source electrode 150 and data line 120 are formed integrally. Furthermore, the gate electrode 130 disposed beyond the scan line 110 and the scan line 110 are formed integrally. In particular, the scan line 110 and the gate electrode 130 are formed by patterning a first metal layer, while the data line 120, the source electrode 150 and the drain electrode 160 are formed by patterning a second metal layer.

If misalignments occur between the first metal layer and the second metal layer during the patterning, relative deviation would occur to the parts formed by the two patterned metal layers. As a result, the overlapping area between the gate electrode 130 and the drain electrode 160 may vary, and the device characteristic of the pixel structure 100 may be affected. In other words, the difference in the gate-drain electrode parasitic capacitance described in the prior art causes the feed-through voltage of the display pixels to vary, so the issue of display quality degradation would occur.

Therefore, in order to avoid the issue of display quality degradation, the present inventions provides a pattern of the drain electrode 160, and the design concept will be detailed as follows. In the present embodiment, the drain electrode 160 includes a comb-shaped part 162 surrounding the source electrode 150 and a connecting part 166. For example, the comb-shaped part 162 includes a first branch 162a, a second branch 162b and a base 162c. In other words, the comb-shaped part 162 may be a "U" shaped pattern, but the comb-shaped part 162 may also include three or more branches, i.e. the comb-shaped part 162 may include two branches or more than two branches. The first branch 162a and the second branch 162b extend from the two ends of the base 162c along a direction D so that the comb-shaped part 162 surrounds the source electrode 150. The base 162c has a straight fringe, but the present invention is not limited thereof, and the base 162c may have a different shaped fringe, such as a sloped fringe. One end of the connecting part 166 is connected to the base 162c, and the other end of the connecting part 166 extends outside the gate electrode 130 toward an opposite direction of the direction D. Thereby, the connecting part 166 partially overlaps the gate electrode 130.

In the present embodiment, the comb-shaped part 162 and the connecting part 166 substantially form a fork shape. In other words, the bottom of the comb-shaped part 162 is connected to the connecting part 166, which has a long narrow shape, to form a fork shape. Furthermore, the connecting part 166 includes a contacting part 168, wherein the contacting part 168 is disposed on one side of the connecting part 166 away from the comb-shaped part 162, and the pixel electrode 170 contacts the contacting part 168 to electrically connect the drain electrode 160. Since the connection method between the pixel electrode 170 and the contacting part 168 is well known in the art, it is therefore not redundantly stated in the present embodiment. Furthermore, at least a dielectric layer is substantially disposed between the first metal layer and the second metal layer, and at least a dielectric layer is also disposed between the pixel electrode 170 and the second metal layer. It should be obvious to those of ordinary skill in the art to understand that these dielectric layers in the present embodiment are not illustrated in the figures for the purpose of illustrating the concept of the present invention more clearly.

It is to be noted that, the first branch 162a extends outside the gate electrode 130 to form a protrusion part 164 outside the gate electrode 130, and the width of the protrusion part 164 and that of the first branch 162a not extending outside the gate electrode 130 are the same. Meanwhile, under such designs, the protrusion part 164 and the connecting part 166 are respectively disposed on the two opposite sides of the gate electrode 130. Assuming that the desired relative position of each of the parts of the pixel structure 100 is illustrated by the solid lines in FIG. 1, when misalignments occur during the alignment steps of the patterning process, the first metal layer shifts in the direction D, and thus, the positions of the data line 120, the source electrode 150 and the drain electrode 160 with respect to the gate electrode 130 are substantially illustrated by the dotted lines. In other words, the data line 120, the source electrode 150 and the drain electrode 160 shift as a whole toward the right side of the figure with respect to the gate electrode 130, namely opposite to the direction D. The overlapping area between the first branch 162a and the gate electrode 130 is therefore increased, while the overlapping area between the connecting part 166 and the gate electrode 130 is therefore decreased accordingly. In other words, the area of the protrusion part 164 has decreased due to the misalignments.

In the present embodiment, the first branch 162a, for instance, has a first width W1, i.e. the width of the protrusion part 164 aligned with the margin of the gate electrode 130 is the first width W1; the second branch 162b, for instance, has a second width W2; and the connecting part 166, for instance, has a third width W3, i.e. the width of the connecting part 166 aligned with the margin of the gate electrode 130 is the third width W3. The protrusion part 164 and the connecting part 166 disposed on the two opposite sides of the gate electrode 130 extend outside the gate electrode 130 respectively from the gate electrode 130. Therefore, in order to achieve the constancy of the gate-drain electrode parasitic capacitance, the width of the protrusion part 164 aligned with the margin of the gate electrode 130 is substantially equal to the width of the connecting part 166 aligned with the margin of the gate electrode 130. In other words, the first width W1 is substantially equal to the third width W3. As a result, the overlapping area between the drain electrode 160 and the gate electrode 130 would be similar to the original pattern design or even the same, which therefore can achieve the constancy of the gate-drain electrode parasitic capacitance.

To be exact, the comb-shaped part 162 and the connecting part 166 of the drain electrode 160 are formed integrally. Thus, the comb-shaped part 162 and the connecting part 166 would have the same relative deviations with respect to the gate electrode 130. The equivalent width design of the first width W1 and the third width W3 makes the overlapping area between the drain electrode 160 and the gate electrode 130 similar to that of the predetermined pattern design, and therefore the constancy of the gate-drain electrode parasitic capacitance is maintained. Through such pattern design, the present embodiment can maintain the display quality of the pixel structure 100. Even when the accuracy of the alignment process is low, the pixel structure 100 would still possess the predetermined display quality. It is to be noted that, when the deviation shifts toward opposite to the direction D, the design of the comb-shaped part 162 and the connecting part 166 can still maintain the constancy of the gate-drain electrode parasitic capacitance. In short, the design of the present embodiment can prevent the negative impacts induced by the deviation occurring in a parallel or opposite direction of the direction D from affecting the device characteristics, so that the pixel structure 100 can possess relatively good display quality with high yield.

It is to be noted that, the length of the protrusion part 164 parallel to the direction D is preferably longer than or at least equal to the possible deviation range of the alignment step during the patterning process. As a result, deviation of the gate electrode 130 and the drain electrode 160 in the parallel or opposite direction of the direction D induced by the low accuracy of the alignment step can be compensated, and the negative impacts affecting the pixel structure 100 can be avoided. Furthermore, even when deviation occurs, the second branch 162b in accordance with the present embodiment, for instance, does not extend outside the gate electrode 130 to ensure the constancy of the gate-drain electrode parasitic capacitance.

In addition, the present embodiment can maintain the constancy of the gate-drain electrode parasitic capacitance of the pixel structure 100. However, since the overlapping area between the drain electrode 160 and the gate electrode 130 has increased with the addition of the protrusion part 164, the gate-drain electrode parasitic capacitance has also increased accordingly. According to the equation (1) of the present technology, an increase in the gate-drain electrode parasitic capacitance increases the feed through voltage $\Delta Vp$.

When the pixel structure 100 is applied to the display panel (not illustrated), a common electrode is disposed opposite to the pixel electrode 170 of the display panel; the display panel utilizes a Clc voltage difference between the pixel electrode 170 and the common electrode to control the display images. The increase in feed-through voltage $\Delta Vp$ would cause a greater voltage drop to the Clc voltage transferred by the data line 120 after charging into the pixel electrode 170, and thus the display quality may be severely affected, e.g. a relatively serious flicker effect may be introduced. In order to prevent the voltage drop mentioned above from affecting the display quality of the display panel, the common voltage of the common electrode can be adjusted when driving the pixel structure 100. Therefore, the pixel structure 100 can still have relatively ideal display quality.

For example, in a display frame, the Clc voltage between the pixel electrode 170 and the common electrode, for instance, requires 3 volts, with an initial feed-through voltage $\Delta Vp$ being 0.4 volts. When the pixel electrode 170 is positively charged, the data line 120 would transfer a voltage of 3.4 volts for charging into the pixel electrode 170, and with the common voltage of the common electrode being 0 volts, the feed-through voltage $\Delta Vp$ has a voltage drop of 0.4 volts; therefore, the Clc voltage between the pixel electrode 170 and the common electrode would be 3 volts. When the pixel electrode 170 is negatively charged, the data line 120 would transfer a voltage of −2.6 volts for charging into the pixel electrode 170, and with the common voltage of the common electrode being 0 volts, the feed through voltage $\Delta Vp$ has a voltage drop of 0.4 volts; therefore, the Clc voltage between the pixel electrode and the common electrode would be 3 volts. Assuming that the design of the present invention is employed, the feed-through voltage $\Delta Vp$ would have increased from the previous 0.4 volts to 0.5 volts. When the pixel electrode 170 is positively charged, the data line 120 would transfer a voltage of 3.4 volts for charging into the pixel electrode 170, and with the common voltage of the common electrode being 0 volts, the feed-through voltage $\Delta Vp$ has a voltage drop of 0.5 volts; as a result, the actual Clc voltage between the pixel electrode and the common electrode is 2.9 volts, which is 0.1 volts less than the 3 volts. When the pixel electrode 170 is negatively charged, the data line 120 would transfer a voltage of −2.6 volts for charging into the pixel electrode 170, and with the common voltage of the common electrode being 0 volt, the feed through voltage $\Delta Vp$ has a voltage drop of 0.5 volts; as a result, the actual Clc voltage between the pixel electrode and the common electrode is 3.1 volts, which is 0.1 volts more than the 3 volts. Therefore, when the pixel is positively charged, the image would be brighter; when the pixel is negatively charged, the image would darker. This leads to flicker effect of the images. Thus, in order to maintain the display quality of the display panel, the common voltage of the common electrode may be adjusted to −0.1 volts. As a result, in accordance with the design of the present invention, whether the pixel electrode 170 is positively charged or the pixel electrode 170 is negatively charged, the pixel structure 100 would still possess a quite ideal display quality.

The embodiment described above is only one design of the present invention, and in order to maintain the constancy of the gate-drain electrode parasitic capacitance, the following will further provide other pixel structure designs. These pixel structure designs are primarily designed so that the protrusion parts and the connecting part disposed on the two opposite sides of the gate electrode have substantially similar or same widths, and thus the pixel structure can achieve ideal display quality.

Figure 2:
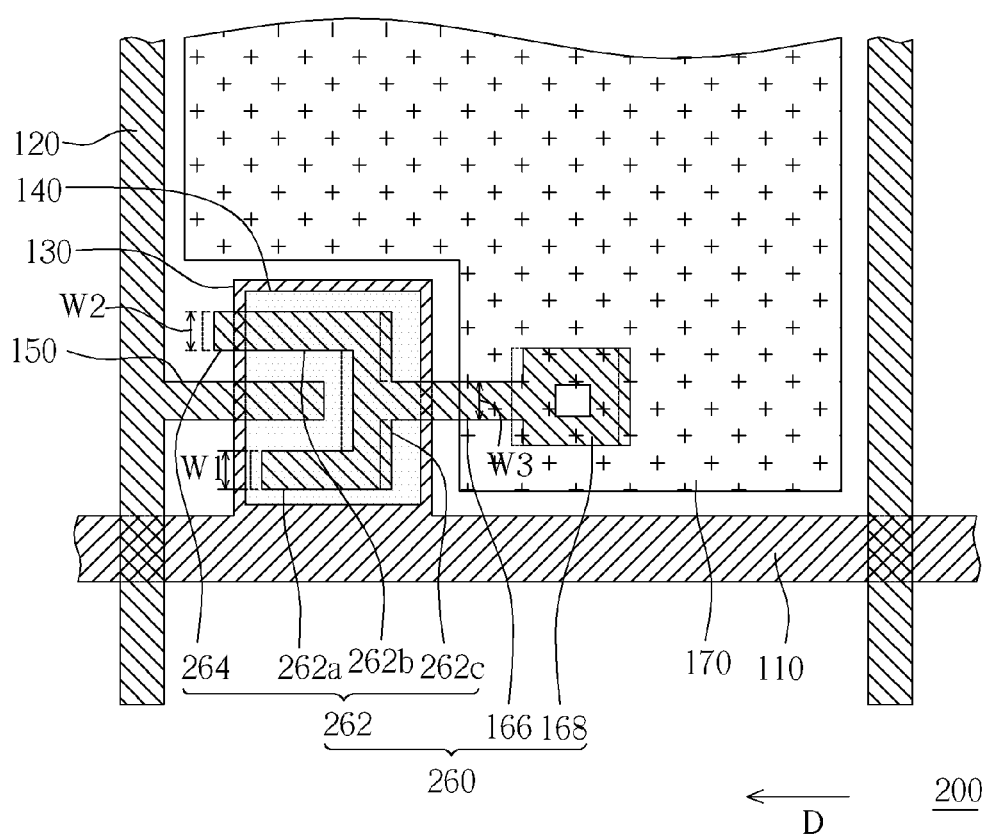
FIG. 2 is a schematic sectional top view diagram illustrating a pixel structure in accordance with a second embodiment of the present invention.

FIG. 2 is a schematic sectional top view diagram illustrating a pixel structure in accordance with a second embodiment of the present invention. Referring to FIG. 2, a pixel structure 200 has the same parts as the pixel structure 100, and therefore identical elements for the pixel structure 200 and the pixel structures 100 are denoted by identical numerals. In short, the pixel structure 200 includes a scan line 110, a data line 120, a pixel electrode 170, and a thin film transistor (not illustrated) consisting of a gate electrode 130, a semiconductor layer 140, a source electrode 150 and a drain electrode 260. It is to be noted that, the difference between the pixel structure 200 and the pixel structure 100 is the pattern design of the drain electrode 260.

To be exact, the drain electrode 260 includes a comb-shaped part 262 surrounding the source electrode 150 and a connecting part 166. The comb-shaped part 262 and the connecting part 166 of the drain electrode 260 are formed integrally. Similar to the previous embodiment, the connecting part 166 includes a contacting part 168, the contacting part 168 is disposed at one side of the connecting part 168 away from the comb-shaped part 262, and the pixel electrode 170 contacts the contacting part 168 to electrically connect with the drain electrode 160.

In the present embodiment, the comb-shaped part 262 includes a first branch 262a, a second branch 262b and a base 262c. The first branch 262a and the second branch 262b, for instance, extend from the two ends of the base 262c respectively toward the direction D, so that the comb-shaped part 262 surrounds the source electrode 150. The base 262c has a straight fringe, but the present invention is not limited thereof, and the base may have a different shaped fringe, such as a sloped fringe. Specially, in the present embodiment, the second branch 262b extends outside the gate electrode 130 to form a protrusion part 264 outside the gate electrode 130, and the protrusion part 264 and the portion of the second branch 262b not extending outside the gate electrode 130 have substantially the same widths. Under such pattern design, the protrusion part 264 and the connecting part 166 are respectively disposed on the two opposite sides of the gate electrode 130. In other words, the difference between the pixel structure 200 and the pixel structure 100 is that their pattern designs of the comb-shaped part 262 are opposite to each other with respect to source electrode 150. Therefore, the present embodiment disposes the source electrode 150 between the protrusion part 264 and the scan line 110, but the embodiment of the pixel structure 100 disposes the protrusion part 164 between the source electrode 150 and the scan line 110.

In the pixel structure 200, the protrusion part 264 and the connecting part 166 are respectively disposed on the two opposite sides of the gate electrode 130, and both extend outside the region of the gate electrode 130. Therefore, if misalignments occur during the process and cause relative deviation of the drain electrode 260 with respect to the position of the gate electrode 130, the gate-drain electrode parasitic capacitance in the pixel structure 200 would still be maintained, the same as the original pattern design.

To be exact, assuming that the misalignments during the manufacturing of the pixel structure 200 cause the drain electrode 260 to shift toward the direction D with respect to the gate electrode 130, the pattern of the drain electrode 260 would shift from the position illustrated by the solid lines to the position illustrated by the dotted lines. In other words, the portion of the second branch 262b extending outside the gate electrode 130 has increased, so that the overlapping area between the second branch 262b and the gate electrode 130 has decreased. Meanwhile, the connecting part 166 also shifts toward the direction D so that the overlapping area between the connecting part 166 and the gate electrode 130 has increased. Thus, the area of the protrusion part 264 will be larger than the predetermined area.

In general, in order to maintain the constancy of the gate-drain electrode parasitic capacitance, the decrease of the overlapping area between the second branch 262b and the gate electrode 130 is preferably equal to the increase of the overlapping area between the connecting part 166 and the gate electrode 130. Therefore, in the present embodiment the width of the protrusion part 264 aligned with the margin of the gate electrode 130 is substantially equal to the width of the connecting part 166 aligned with the margin of the gate electrode 130. That is, the second width W2 of the second branch 262b is substantially equal to the third width W3 of the connecting part 166. By such drain electrode 260 pattern design, the pixel structure 200 can possess relatively good display quality, and the misalignment tolerance of the pixel structure 200 can also be improved significantly. In other words, the present embodiment also utilizes the pattern design of the drain electrode 260 so that the portions where the drain electrode 262 does not overlap the gate electrode 130 are respectively disposed on the two opposite sides of the gate electrode 130, and these portions have substantially the same line widths to avoid the negative impacts induced by the low accuracy of the process which affects the display quality of the pixel structure 200.

Figure 3:
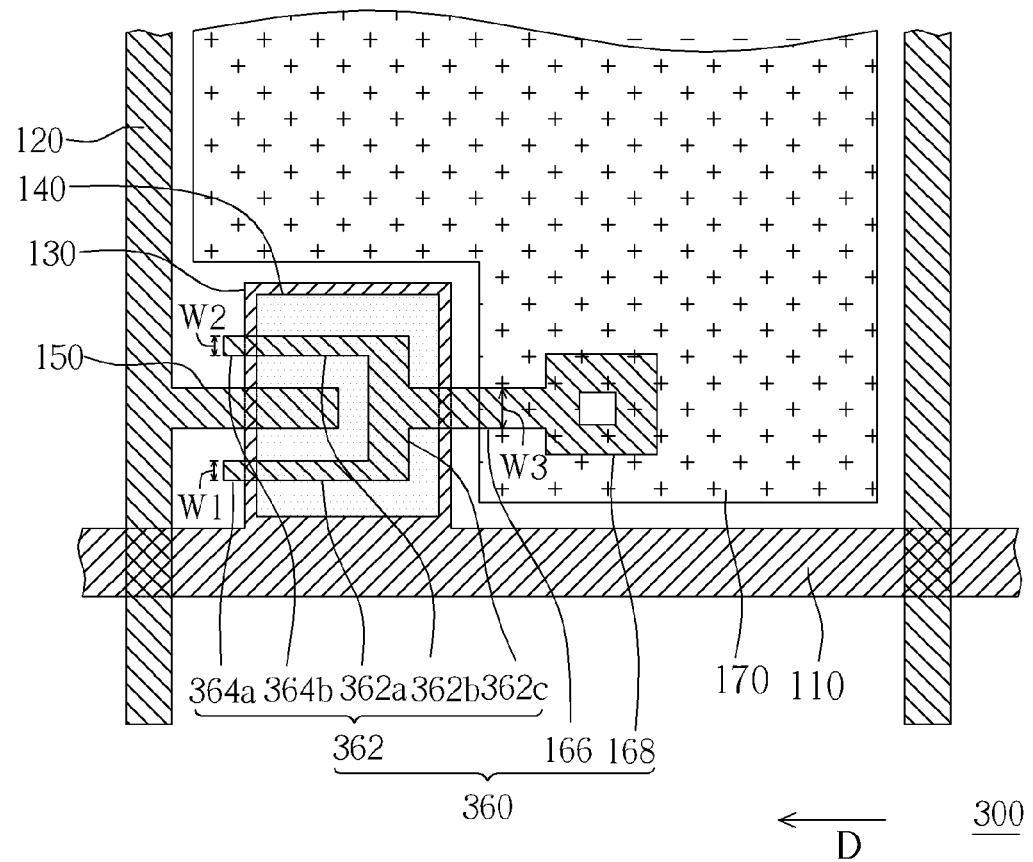
FIG. 3 is a schematic sectional top view diagram illustrating a pixel structure in accordance with a third embodiment of the present invention.

The designs described above have one of the branches of the comb-shaped part extending outside the region of the gate electrode, but the present invention is not limited thereof. In other embodiments, two branches of the comb-shaped part can extend outside the region of the gate electrode, and the constancy of the gate-drain electrode parasitic capacitance is maintained by adjusting line widths. For example, FIG. 3 is a sectional schematic top view diagram illustrating a pixel structure in accordance with a third embodiment of the present invention. Referring to FIG. 3, the difference between the pixel structure 300 and the previous embodiments is the pattern design of the drain electrode 360, and therefore, some of the components in the pixel structure 300 are denoted by the same numerals as the previous embodiments. In other words, in the pixel structure 100, 200 and 300, same numerals are used to represent identical components having the same functions and the same configurations.

To be exact, in the present embodiment, the drain electrode 360 includes a first branch 362a, a second branch 362b and a base 362c. The first branch 362a and the second branch 362b, for instance, extend from the two ends of the base 362c toward a direction D so that the comb-shaped part 362 surrounds the source electrode 150. The base 362c has a straight fringe, but the present invention is not limited thereof, and the base may have a different shaped fringe, such as a sloped fringe. It is to be noted that, the first branch 362a and the second branch 362b both extend outside the gate electrode 130 to form two protrusion parts 364a and 364b outside the gate electrode 130 respectively, wherein the widths of the protrusion part 364a and the first branch 362a not extending outside the gate electrode 130 are the same, and the widths of the protrusion part 364b and the second branch 362b not extending outside the gate electrode 130 are the same. Under such designs, the two protrusion parts 364a, 364b and the connecting part 166 are respectively disposed on the two opposite sides of the gate electrode 130, and the comb-shaped part 362 and the connecting part 166 of the drain electrode 360 substantially form a fork shape. In other words, the difference between the pixel structure 300 and the pixel structure 100 and 200 is that the comb-shaped part 362 has two protrusion parts 364a and 364b.

In the pixel structure 300, when misalignments of the process causes the drain electrode 360 to shift toward the direction D with respect to the position of the gate electrode 130, the overlapping area between the connecting part 166 and the gate electrode 130 is therefore increased, and the area of the first branch 326a overlapping the gate electrode 130 and the area of the second branch 362b overlapping the gate electrode 130 are therefore decreased. Of course, the areas of the protrusion parts 364a, 364b have increased accordingly.

Meanwhile, in order to maintain the constancy of the gate-drain electrode parasitic capacitance, the increase of the overlapping area between the connecting part 166 and the gate electrode 130 is substantially equal to the decrease of the sum of the area of the first branch 362a overlapping the gate electrode 130 and the area of the second branch 362b overlapping the gate electrode 130. Therefore, in the present embodiment, the first width W1 of the first branch 362a, the second width W2 of the second branch 362b and the third width W3 of the connecting part 166, have a relationship, such as the sum of the first width W1 and the second width W2 is substantially equal to the third width W3. In other words, the pattern of the drain electrode 360 extending to the right side of the gate electrode 130 has a width substantially equal to the sum of the widths of the patterns of the drain electrode 360 extending to the left side of the gate electrode 130.

Figure 4:
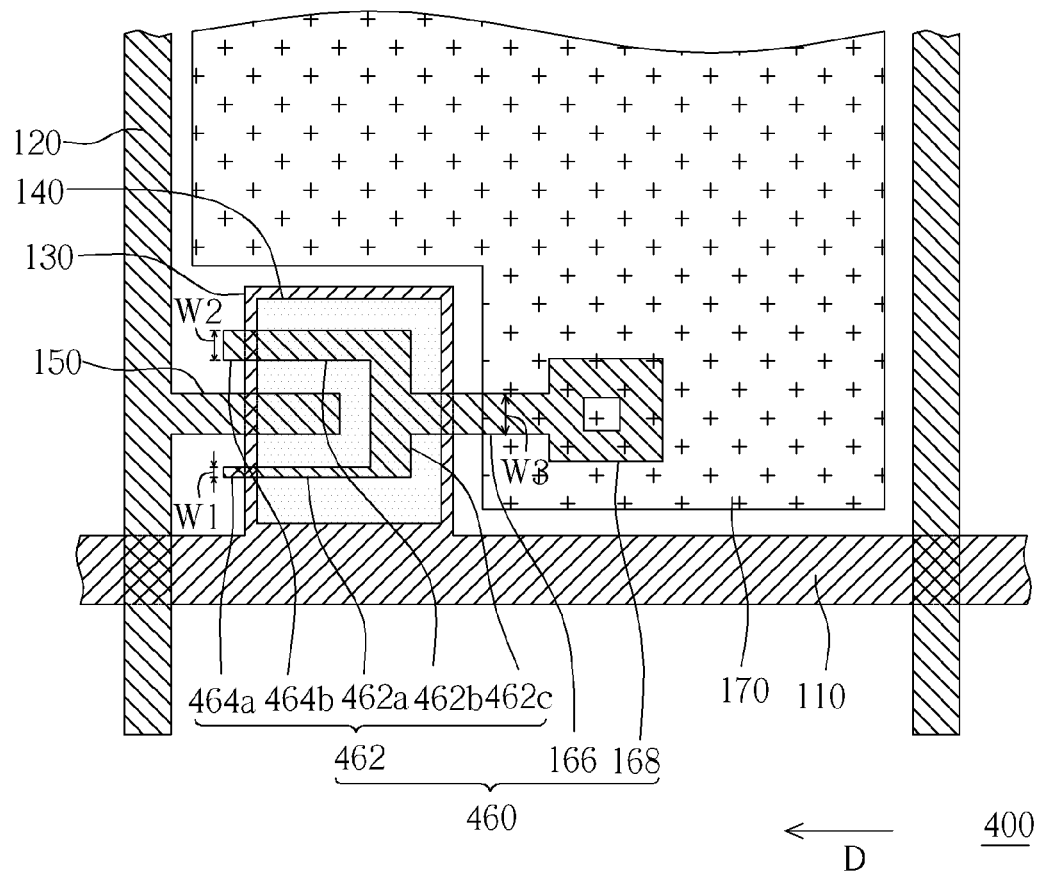
FIG. 4 is a schematic sectional top view diagram illustrating a pixel structure in accordance with a fourth embodiment of the present invention.

In addition, in the design of the drain electrode 362 in accordance with the present embodiment, for instance, the first width W1 is substantially equal to the second width W2. However, in other embodiments, the first width W1 may not be equal to the second width W2. For example, FIG. 4 is a schematic sectional top view diagram illustrating a pixel structure in accordance with a fourth embodiment of the present invention. Referring to FIG. 4, the difference between the pixel structure 400 and the pixel structure 300 is only that in the pixel structure 400, the first width W1 does not equal to the second width W2. In other words, in the pixel structure 400, a comb-shaped part 462 of a drain electrode 460 has an asymmetrical branch width design relative to the source electrode 150. That is, a first branch 462a and a second branch 462b have different widths. Under such pattern layout, a protrusion part 464a extending from the first branch 462a and a protrusion part 464b extending from the first branch 462b have different widths.

To be exact, the first width W1 of the present embodiment is narrower than the second width W2, and the sum of the first width W1 and the second width W2 is substantially equal to the third width W3. By such width design, if misalignments occur to the pixel structure 400 during the process and cause the gate electrode 130 and the drain electrode 460 to have relative deviation, the overlapping area between the gate electrode 130 and the drain electrode 460 would still be maintained constant. As a result, the gate-drain electrode parasitic capacitance can be maintained at a constant value, so that the pixel structure 400 can possess good display quality as well as can improve the misalignment tolerance. It is to be noted that, the present embodiment does not limit that the first width W1 is narrower than the second width W2, and the first width W1 can be wider than the second width W2.

Figure 5:
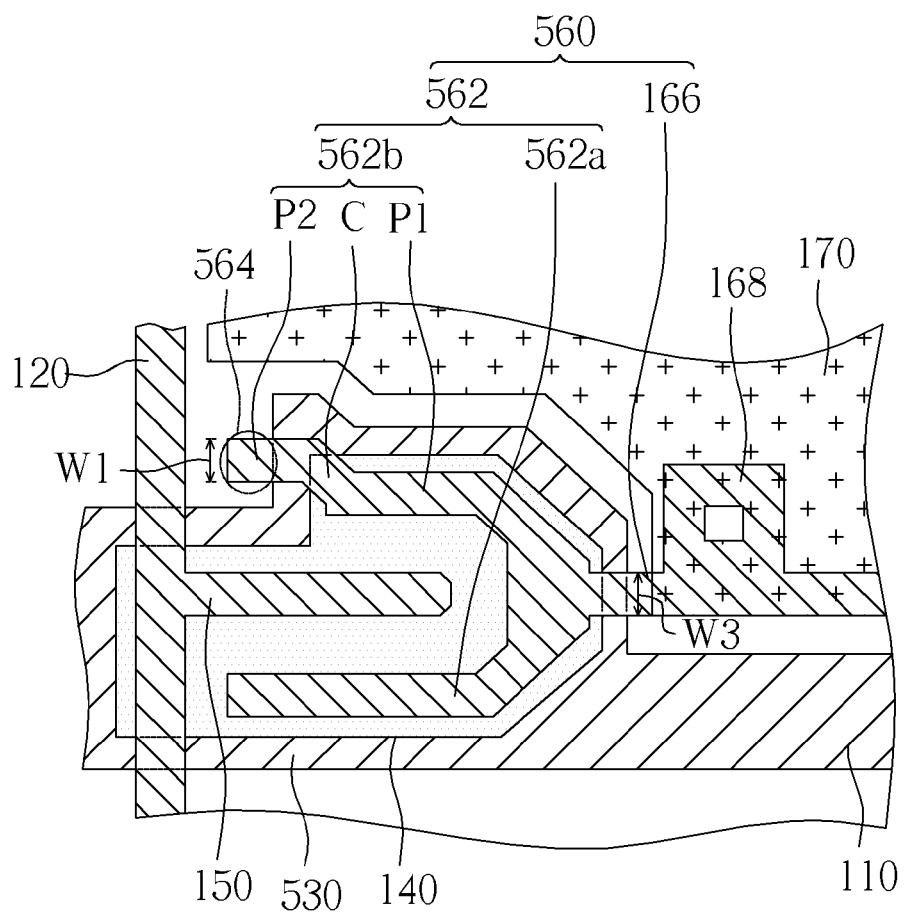
FIG. 5 is a schematic sectional top view diagram illustrating a pixel structure in accordance with a fifth embodiment of the present invention.

The branches of the comb-shaped part of the pixel structure described above are all linear-shaped. In fact, the branches of the comb-shaped part may also have an angular portion. FIG. 5 is a schematic section top-view diagram illustrating a pixel structure in accordance with a fifth embodiment of the present invention. Referring to FIG. 5, a pixel structure 500 includes a scan line 110, a data line 120, a pixel electrode 170 and a thin film transistor (not illustrated) consisting of a gate electrode 530, a semiconductor layer 140, a source electrode 150 and a drain electrode 560. It is to be noted that the drain electrode 560 includes a comb-shaped part 562 surrounding the source electrode 150 and a connecting part 166, and the comb-shaped part 56 and the connecting part 166 are formed integrally. Similar to the previous embodiments, the connecting part 166 includes a contacting part 168, the contacting part 168 is disposed on one side of the connecting part away from the comb-shaped part 562, and the pixel electrode 170 contacts the contacting part168 to electrically connect with the drain electrode 560. It is to be noted that, a portion of the gate electrode 530 in accordance with the present embodiment can be substantially formed by the scan line 110. Furthermore, the source electrode 150 and the data line 120 may be formed integrally.

In the present embodiment, the comb-shaped part 562 includes a first branch 562a and a second branch 562b. The comb-shaped part 562 is substantially composed of the two branches 562a, 562b and a base (not illustrated) connecting the two branches 562a, 562b. The two branches 562a, 562b extend from the base (not illustrated) toward the data line 120, and the connecting part 166 extends from the base (not illustrated) toward opposite to the data line 120. The base has a sloped fringe. Therefore, the comb-shaped part 562 and the connecting part 166 substantially form a fork shape, and the comb-shaped part 562 and the connecting part 166 of the drain electrode 560 are formed integrally. The first branch 562a and the second branch 562b, for instance, are respectively disposed on the two opposite sides of the source electrode 150. Furthermore, the second branch 562b is composed of a first parallel part P1, a sloped part C and a second parallel part P2 to form the second branch 562b having an angular portion. The sloped part C is connected to the first parallel part P1 and the second parallel part P2, and the second parallel part P2 extends outside the gate electrode 130 to form a protrusion part 564. The protrusion part 564 and the portion of the second parallel part P2 not extending outside the gate electrode 130 have the same widths.

It is to be noted that, one end of the sloped part C connected to the first parallel part P1, for instance, is closer to the source electrode 150, and the other end of the sloped part C connected to the second parallel part P2 is away from the source electrode 150. Also, in the second branch 562b, the first parallel part P1 and the sloped part C are both disposed on the gate electrode 130 and the semiconductor layer 140, while the second parallel part P2 extends outside the gate electrode 130. Furthermore, the semiconductor layer 140 in accordance with the present embodiment is disposed completely within the gate electrode 130. Therefore, the semiconductor layer 140 and the protrusion part 564 do not form overlapping area. In other words, the overlapping area between the semiconductor layer 140 and the protrusion part 564 is zero, that is, the protrusion part 564 is located outside the semiconductor layer 140. Therefore, the issue of current leakage induced by the irradiation of light would not occur. Moreover, in the present embodiment, the margin of the gate electrode 530 either extends to overlap the portion of the data line 120 or extends to overlap both of the portions of the scan line 110 and the data line 120. As illustrated in FIG. 5, a portion of the scan line 110 serves the function of the gate electrode 530 because the gate electrode 530 partially overlaps the scan line 110, and the gate electrode 530 and the scan line110 are formed integrally. In addition, the gate electrode 530 also partially overlaps the data line 120, and therefore the aperture ratio of the pixel structure 500 is improved. In the present embodiment, the design of the gate electrode 530 is within the grasp of those having ordinary skill in the art, and is not discussed in detail. Furthermore, in order to connect with the pixel electrode 170, the connecting part 166 includes a contacting part 168, and the contacting part 168 is disposed on one side of the connecting part 166 away from the comb-shaped part 562.

In the present embodiment, the protrusion part 564 aligned with the margin of the gate electrode 130 has a first width W1, and the first width W1 is substantially equal to the width of the protrusion part 564. Furthermore, the connecting part 166 partially overlaps the gate electrode 130, the connecting part 166 aligned with the margin of the gate electrode 130 has a third width W3, i.e. the width of the connecting part 166, and the first width W1 is substantially equal to the third width W3. Thus, by matching the first width W1 and the third width W3, the device characteristics of the pixel structure 500 is not affected by the misalignments during the manufacturing of the pixel structure 500. As a result, the pixel structure 500 can possess relatively good display quality with high yield.

Figure 6:
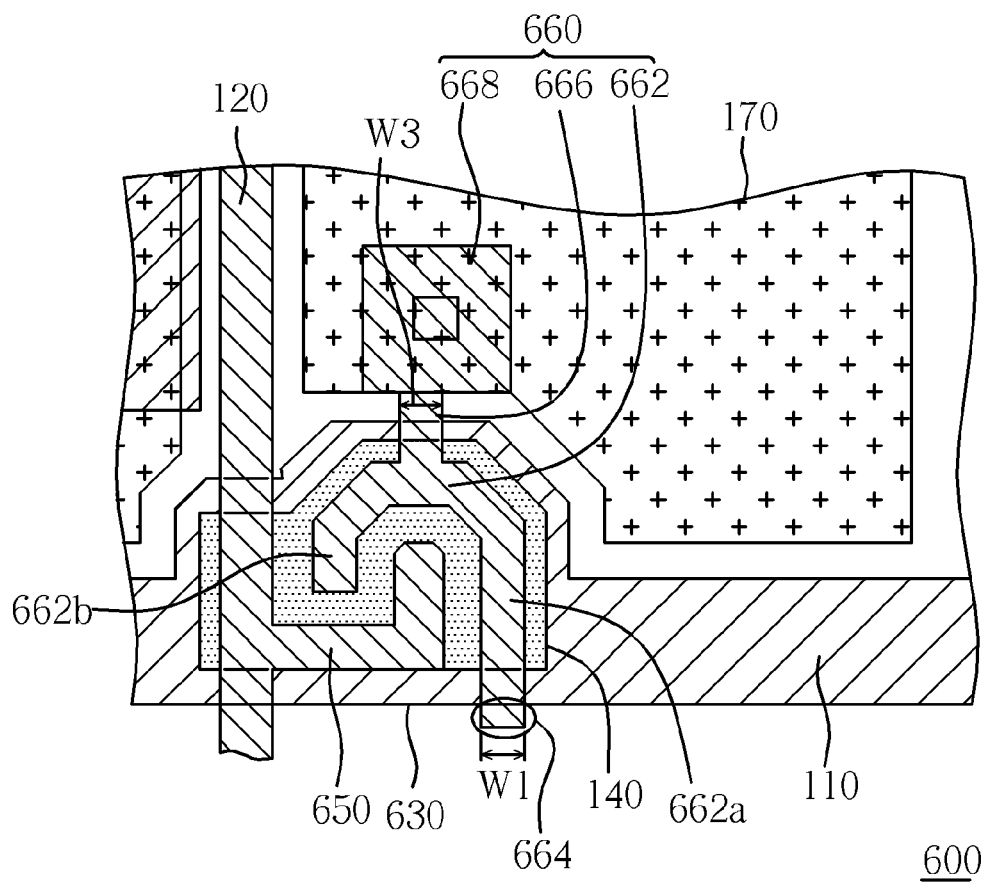
FIG. 6 is a schematic sectional top view diagram illustrating a pixel structure in accordance with a sixth embodiment of the present invention.

In addition, in the pixel structure, the design of the thin film transistor is not limited by the embodiments described above. FIG. 6 is a schematic sectional top view diagram illustrating a pixel structure in accordance with a sixth embodiment of the present invention. Referring to FIG. 6, a pixel structure 600 includes a scan line 110, a data line 120, a pixel electrode 170, and a thin film transistor (not illustrated) composed of a gate electrode 630, a semiconductor layer 140, a source electrode 650 and a drain electrode 660. It is to be noted that, a portion of the gate electrode 630 is formed by the scan line 110, and the source electrode 650 is an "L" shaped pattern. The drain electrode 660 includes a comb-shaped part 662 surrounding the source electrode 650 and a connecting part 666. Similar to the previous embodiments, the connecting part 666 includes a contacting part 668 disposed on one side of the connecting part away from the comb-shaped part 662, and the pixel electrode 170 contacts the contacting part 668 to electrically connect with the drain electrode 660.

In the present embodiment, a first branch 662a and a second branch 662b of the drain electrode 660 are substantially parallel to the data line 120, wherein the first branch 662a extends outside the gate electrode 630 and the gate line 110 to form a protrusion part 664, and the protrusion part 664 and the portion of the first branch 662a not extending outside the gate electrode 630 have the same widths. Since a portion of the gate electrode 630 is formed by the scan line 110, the protrusion part 664 and the connecting part 666 are respectively disposed on two opposite sides of the scan line 110. It is to be noted that the protrusion part 664 aligned with the margin of the gate electrode 630 has a first width W1. The connecting part 666 aligned with the margin of the gate electrode 630 has a third width W3, and the first width W1 is substantially equal to the third width W3. Thus, similarly, the pixel structure 600 has a relative higher misalignment tolerance. In other words, the pixel structure 600 possesses good display quality.

In summary, the drain electrode in accordance with the present invention includes the comb-shaped part and the connecting part, and the branches of the comb-shaped part and the connecting part extend outside the two opposite sides of the gate electrode respectively. Meanwhile, the patterns of the drain electrode extending outside the two opposite sides of the gate electrode have substantially the same line widths. Also, the comb-shaped part in accordance with the present invention is not limited to two branches as described in the embodiments above, and the design of multiple branches is obvious to those of ordinary skill in the art. In addition, the width design of the comb-shaped part in accordance with the present invention is also not limited by the embodiments above. That is, the width of the portion of the branches not extending outside the gate electrode and the width of the protrusion part may be the same. However, the width of portion of the branches not extending outside the gate electrode and the width of the protrusion part may be different and it should be obvious to those of ordinary skill in the art. Furthermore, the branches of the comb-shaped part in accordance with the present invention are not limited to the shape being linear-shaped and the shape having an angular portion by the embodiments above, and other shapes should be obvious to those of ordinary skill in the art. Therefore, the thin film transistor of the pixel structure has a constant gate-drain electrode parasitic capacitance. In other words, the pixel structure in accordance with the present invention has a relatively high misalignment tolerance and has relatively stable display quality. Thus, when the pixel structure in accordance with the present invention is applied to the display device, the display quality of the display device can be improved.

Those skilled in the art will readily observe that numerous modifications and alterations of the device and method may be made while retaining the teachings of the invention.

What is claimed is:

1. A pixel structure, comprising:
a scan line and a data line, arranged intersectedly and electrically insulated from each other;
a gate electrode electrically connected to the scan line;
a semiconductor layer disposed on the gate electrode;
a source electrode, having at least a portion disposed on the semiconductor layer, and connected to the data line;
a drain electrode, having at least a portion disposed on the semiconductor layer, the drain electrode comprising:
a comb-shaped part, surrounding the source electrode, the comb-shaped part comprising at least two branches, at least one of the branches extending outside the gate electrode to form at least a protrusion part outside the gate electrode; wherein one of the branches extends outside the gate electrode, and the other branch is disposed within the region of the gate electrode completely, so that one protrusion part exists;
a connecting part, extending from the comb-shaped part beyond the gate electrode, the protrusion part and the connecting part being respectively disposed on two opposite sides of the gate electrode, wherein the protrusion part aligned with the margin of the gate electrode has a first width, and the connecting part aligned with the margin of the gate electrode has a third width, wherein the first width is substantially equal to the third width; and
a pixel electrode, electrically connected to the drain electrode.

2. The pixel structure of claim 1, wherein the source electrode is disposed between the protrusion part and the scan line.

3. The pixel structure of claim 1, wherein the protrusion part is disposed between the source electrode and the scan line.

4. The pixel structure of claim 1, wherein the first width substantially equals to the width of the protrusion part.

5. The pixel structure of claim 1, wherein the connecting part comprises a contacting part disposed on a side of the connecting part away from the comb-shaped part, and the pixel electrode contacts the contacting part.

6. The pixel structure of claim 1, wherein the comb-shaped part further includes the at least two branches and a base, the at least two branches extend from the base toward one direction, and the connecting part is connected to the base and extends from the base toward the opposite direction.

7. The pixel structure of claim 1, wherein the connecting part partially overlaps the gate electrode.

8. The pixel structure of claim 1, wherein the comb-shaped part and the connecting part substantially form a fork shape.

9. The pixel structure of claim 1, wherein the comb-shaped part and the connecting part of the drain electrode are formed integrally.

10. The pixel structure of claim 1, wherein the source electrode and the data line are formed integrally.

11. The pixel structure of claim 1, wherein the gate electrode disposed beyond the scan line and the scan line are formed integrally.

12. The pixel structure of claim 1, wherein the branches are parallel to the data line.

13. The pixel structure of claim 12, wherein a portion of the gate electrode is formed by the scan line.

14. The pixel structure of claim 12, wherein the protrusion part and the connecting part are respectively disposed on two opposite sides of the scan line.

15. A pixel structure, comprising:
a scan line and a data line, arranged intersectedly and electrically insulated from each other;
a gate electrode, electrically connected to the scan line;
a semiconductor layer, disposed on the gate electrode;
a source electrode, having at least a portion disposed on the semiconductor layer, and connected to the data line;
a drain electrode, having at least a portion disposed on the semiconductor layer, the drain electrode comprising:
a comb-shaped part, surrounding the source electrode, the comb-shaped part comprising at least two branches, at least one of the branches comprising a first parallel part, a sloped part and a second parallel part to form the branch having an angular portion, the sloped part being connected to the first parallel part and the second parallel part, and the second parallel part extending outside the gate electrode to form at least a protrusion part; wherein the protrusion part is located outside the semiconductor layer;
a connecting part, extending from the comb-shaped part beyond the gate electrode, and the protrusion part and the connecting part being respectively disposed on two opposite sides of the gate electrode, wherein the protrusion part aligned with the margin of the gate electrode has a first width, and the connecting part aligned with the margin of the gate electrode has a third width, wherein the first width is substantially equal to the third width; and a pixel electrode, electrically connected to the drain electrode.

16. The pixel structure of claim 15, wherein the source electrode is disposed between the protrusion part and the scan line.

17. The pixel structure of claim 15, wherein the first width is substantially equal to the width of the protrusion part.

18. The pixel structure of claim 15, wherein the connecting part comprises a contacting part, disposed on one side of the connecting part away from the comb-shaped part, and the pixel electrode connects the contacting part.

19. The pixel structure of claim 15, wherein the comb-shaped part further includes the at least two branches and a base, the at least two branches extend from the base toward one direction, and the connecting part is connected to the base and extends from the base toward the opposite direction.

20. The pixel structure of claim 15, wherein the connecting part partially overlaps the gate electrode.

21. The pixel structure of claim 15, wherein the comb-shaped part and the connecting part substantially form a fork shape.

22. The pixel structure of claim 15, wherein the margin of the gate electrode either extends to overlap a portion of the data line or extends to overlap both of the portions of the scan line and the data line.

* * * * *